US010923373B2

(12) United States Patent
Ogawa

(10) Patent No.: US 10,923,373 B2
(45) Date of Patent: Feb. 16, 2021

(54) SUBSTRATE STORAGE CONTAINER AND GAS REPLACEMENT UNIT

(71) Applicant: Shin-Etsu Polymer Co., Ltd., Tokyo (JP)

(72) Inventor: Osamu Ogawa, Saitama (JP)

(73) Assignee: Shin-Etsu Polymer Co., Ltd., Tokyo (JP)

( * ) Notice: Subject to any disclaimer, the term of this patent is extended or adjusted under 35 U.S.C. 154(b) by 107 days.

(21) Appl. No.: 16/330,161

(22) PCT Filed: Aug. 2, 2017

(86) PCT No.: PCT/JP2017/028127
§ 371 (c)(1),
(2) Date: Mar. 4, 2019

(87) PCT Pub. No.: WO2018/047541
PCT Pub. Date: Mar. 15, 2018

(65) Prior Publication Data
US 2019/0189485 A1 Jun. 20, 2019

(30) Foreign Application Priority Data
Sep. 6, 2016 (JP) .................................. 2016-174023

(51) Int. Cl.
*B65D 85/30* (2006.01)
*H01L 21/673* (2006.01)

(52) U.S. Cl.
CPC ........ *H01L 21/67389* (2013.01); *B65D 85/30* (2013.01); *H01L 21/673* (2013.01)

(58) Field of Classification Search
CPC . B65D 85/30; H01L 21/673; H01L 21/67389; H01L 21/67393

(Continued)

(56) References Cited

U.S. PATENT DOCUMENTS

| 5,879,458 A | * | 3/1999 | Roberson, Jr. .... H01L 21/67017 |
| | | | 118/715 |
| 6,187,182 B1 | * | 2/2001 | Reynolds ........... B01D 46/0004 |
| | | | 210/136 |

(Continued)

FOREIGN PATENT DOCUMENTS

| JP | 2011514014 A | 4/2011 |
| JP | 20164949 A | 1/2016 |
| JP | 2016105443 A | 6/2016 |

OTHER PUBLICATIONS

Third Party Observation filed for PCT/JP2017/028127.

*Primary Examiner* — Luan K Bui
(74) *Attorney, Agent, or Firm* — The Webb Law Firm

(57) ABSTRACT

A substrate storage container and gas replacement units are provided in which variations in humidity or concentration in an internal space are small. This is achieved by providing a container body capable of housing substrates, at least one intake valve for supplying an external gas to the internal space of the container body, and gas replacement units for blowing the supplied gas into the internal space of the container body. The container body is formed in an open front box, the intake valve is attached at the back of the bottom surface of the container, the gas replacement units each include a housing member and a cover member, each housing member has a plurality of first blowout holes for blowing the stored gas in one direction, and each cover member has a plurality of second blowout holes for blowing in a direction substantially opposite direction.

20 Claims, 17 Drawing Sheets

(58) Field of Classification Search
USPC .................................. 206/454, 710, 711, 832
See application file for complete search history.

(56) References Cited

U.S. PATENT DOCUMENTS

| | | | |
|---|---|---|---|
| 6,368,411 | B2 | 4/2002 | Roberson, Jr. et al. |
| 6,732,877 | B2* | 5/2004 | Wu .................... B65D 51/1616 |
| | | | 206/710 |
| 8,091,592 | B2* | 1/2012 | Sato ...................... F16K 15/063 |
| | | | 141/63 |
| 9,054,144 | B2 | 6/2015 | Burns et al. |
| 2008/0298933 | A1 | 12/2008 | Hsiao et al. |
| 2011/0114534 | A1* | 5/2011 | Watson ............. H01L 21/67393 |
| | | | 206/710 |
| 2015/0041360 | A1 | 2/2015 | Watson et al. |
| 2017/0213752 | A1* | 7/2017 | Ogawa .............. H01L 21/67386 |

\* cited by examiner

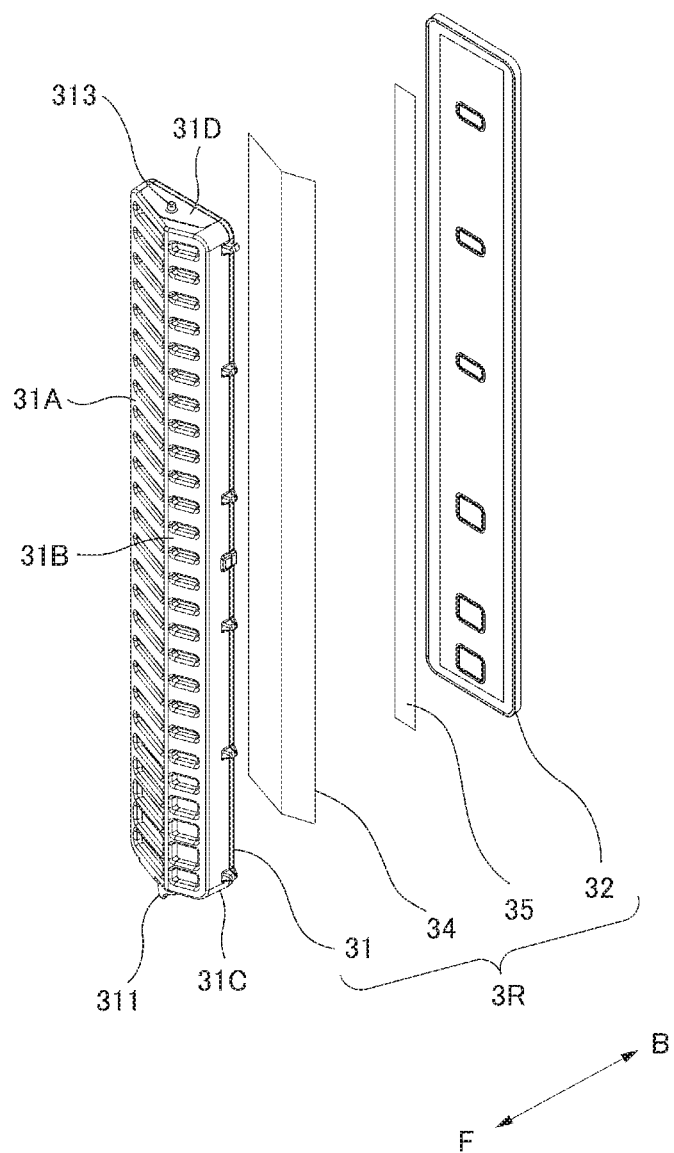

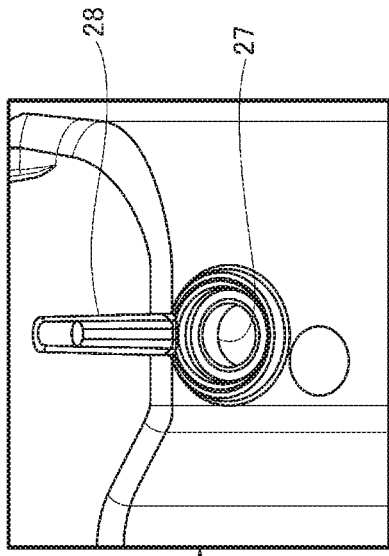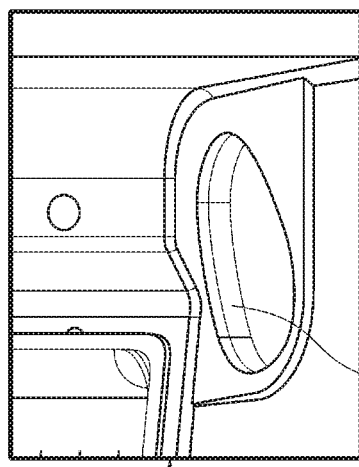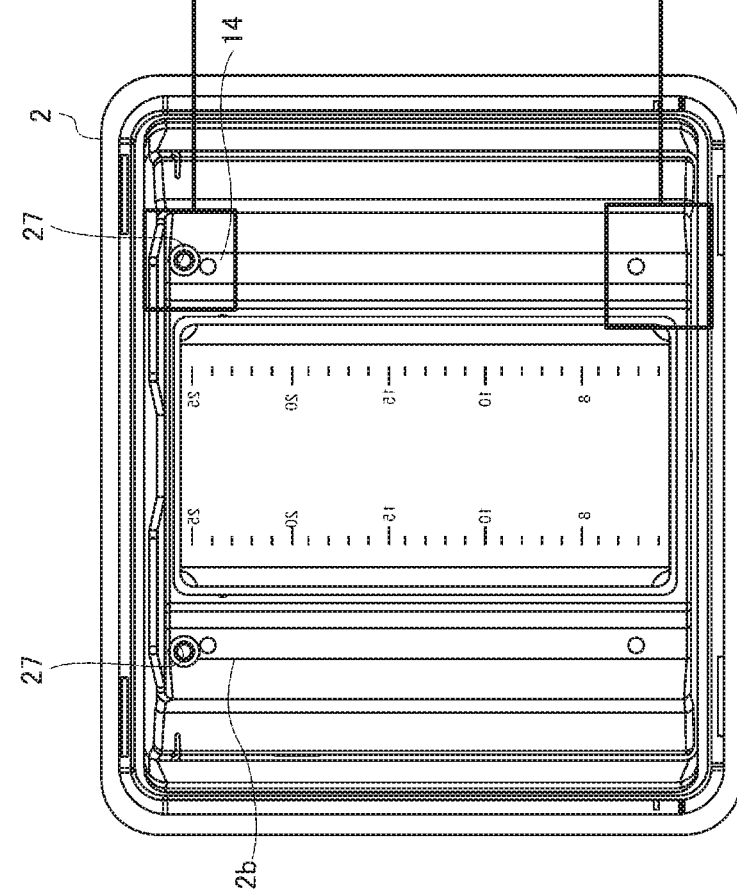

SUBSTRATE STORAGE CONTAINER AND GAS REPLACEMENT UNIT

CROSS-REFERENCE TO RELATED APPLICATIONS

This application is the United States national phase of International Application No. PCT/JP2017/028127 filed Aug. 2, 2017, and claims priority to Japanese Patent Application No. 2016-174023 filed Sep. 6, 2016, the disclosures of which are hereby incorporated by reference in their entirety.

TECHNICAL FIELD

The present invention relates to a substrate storage container and a gas replacement unit for accommodating a plurality of substrates.

BACKGROUND ART

Substrates such as semiconductor wafers are stored in the internal space of a substrate storage container which is used for storage in a warehouse, transportation between semiconductor processing devices, transportation between factories, or the like. In order to prevent oxidation or contamination of the substrates accommodated in the internal space, the internal space may be replaced with an inert gas such as nitrogen gas or dry air.

Such a substrate storage container includes a container main body for storing a plurality of substrates and a lid detachably fitted on the opening of the container main body, wherein intake valves for supplying a gas from outside of the container main body to the internal space is fitted to the bottom plate of the container main body, a hollow blowout nozzle communicating with the intake valves is provided upright, and a blowout hole for blowing gas toward the substrate is provided on the peripheral wall of the blowout nozzle (See Japanese Unexamined Patent Application 2016-4949).

SUMMARY OF THE INVENTION

However, in the substrate storage container disclosed in Patent Document 1, when the stored state of the substrate changes, variations in the humidity or the concentration of the gas between the substrates may increase.

Therefore, the present invention has been made in view of the above problems, so that even if the stored state of the substrates changes, an object of the present invention is to provide a substrate storage container and a gas replacement unit in which variations in humidity or concentration of gas are small in the internal space.

(1) According to embodiments of the present invention a substrate container comprises a container body capable of storing a plurality of substrates, at least one intake valve for supplying gas from an external source from the container body to the container body's internal space, and at least one gas replacement unit which blows the gas supplied from the at least one intake valve into the internal space of the container body, wherein the container body is formed into a front opening box and the at least one intake valve is attached to the rear of the bottom surface, wherein each of the at least one gas replacement unit includes a housing member which stores the gas supplied from the at least one intake valve, and a cover member which covers an opening of the housing member, wherein the opening of the housing member is oriented in the rearward direction of the container body and the lower portion of the housing member is connected to the at least one intake valve, wherein the housing member has a plurality of first blowout holes for blowing the stored gas toward the front of the container body, and wherein the cover member has a plurality of second blowout holes for blowing out in a rearward direction opposite to the blowing direction of the first blowout holes.

(2) According to embodiments of the present invention, a substrate container comprises a container body capable of storing a plurality of substrates, at least one intake valve for supplying gas from the an external source from the container body to the container body's internal space, and at least one gas replacement unit which blows the gas supplied from the at least one intake valve into the internal space of the container body, wherein the container body is formed into a front opening box and the at least one intake valve is attached to the rear of the bottom surface, wherein each of the at least one gas replacement unit includes a housing member which stores the gas supplied from the at least one intake valve, and a cover member which covers an opening of the housing member, wherein the opening of the housing member is oriented in the front direction of the container body, and the lower portion of the housing member is connected to the at least one intake valve, wherein the cover member has a plurality of first blowout holes for blowing the stored gas toward the front of the container body, and wherein the housing member has a plurality of second blowout holes for blowing out in a rearward direction opposite to the blowing direction of the first blowout holes.

(3) According to some embodiments, the at least one of the gas replacement units blows out the gas in three different directions.

(4) According to some embodiments, at least one of the upper part and the central part of the housing member is positioned and fixed by using a through hole formed in the rear wall of the container body.

(5) According to some embodiments, at least one of the first blowout holes is positioned lower than the lowermost level of the substrates stored in the container body.

(6) According to some embodiments, the gas replacement unit includes at least one air permeable filter member inside the housing member and the cover member.

(7) According to some embodiments, the gas is nitrogen gas or dry air.

(8) According to embodiments of the present invention in a gas replacement unit for a substrate storage container having a container body capable of storing a plurality of substrates, and at least one intake valve for supplying gas from an external source from the container body to the internal space with the at least one intake valve attached at the rear of a bottom surface of the container body, the gas replacement unit comprising a housing member which stores the gas supplied from the at least one intake valve, and a cover member which covers the opening of the housing member, wherein the opening of the housing member is oriented in the rearward direction of the container body and the lower portion of the housing member is connected to the at least one intake valve, wherein the housing member has a plurality of first blowout holes for blowing the stored gas toward the front of the container body, and wherein the cover member has a plurality of second blowout holes for blowing out in a rearward direction opposite to the blowing direction of the first blowout holes.

(9) According to embodiments of the present invention in a gas replacement unit for a substrate storage container having a container body capable of storing a plurality of substrates, and at least one intake valve for supplying gas from an external source from the container body to the internal space with the at least one intake valve attached at the rear of a bottom surface of the container body, the gas replacement unit comprising a housing member which stores the gas supplied from the at least one intake valve, and a cover member which covers the opening of the housing member, wherein the opening of the housing member is oriented in the front direction of the container body, the lower portion of the housing member is connected to the at least one intake valve, wherein the cover member has a plurality of first blowout holes for blowing the stored gas toward the front of the container body, and wherein the housing member has a plurality of second blowout holes for blowing out in a rearward direction opposite to the blowing direction of the first blowout holes.

According to the present invention, even if the stored state of the substrates changes, providing a substrate storage container and a gas replacement unit in which variations in humidity or concentration of the gas are small within the internal space is possible.

BRIEF DESCRIPTION OF DRAWINGS

FIG. 6 is an exploded perspective view of the gas replacement unit of the first embodiment.

FIG. 9A is front schematic view of the container body, FIG. 9B is an enlarged perspective view of an upper attachment portion of the gas replacement unit, and FIG. 9C is an enlarged perspective view of the lower attachment portion of the gas replacement unit.

FIG. 5D is a rear view of the gas replacement unit of the second embodiment.

DETAILED DESCRIPTION OF EMBODIMENTS OF THE INVENTION

Figure 1:
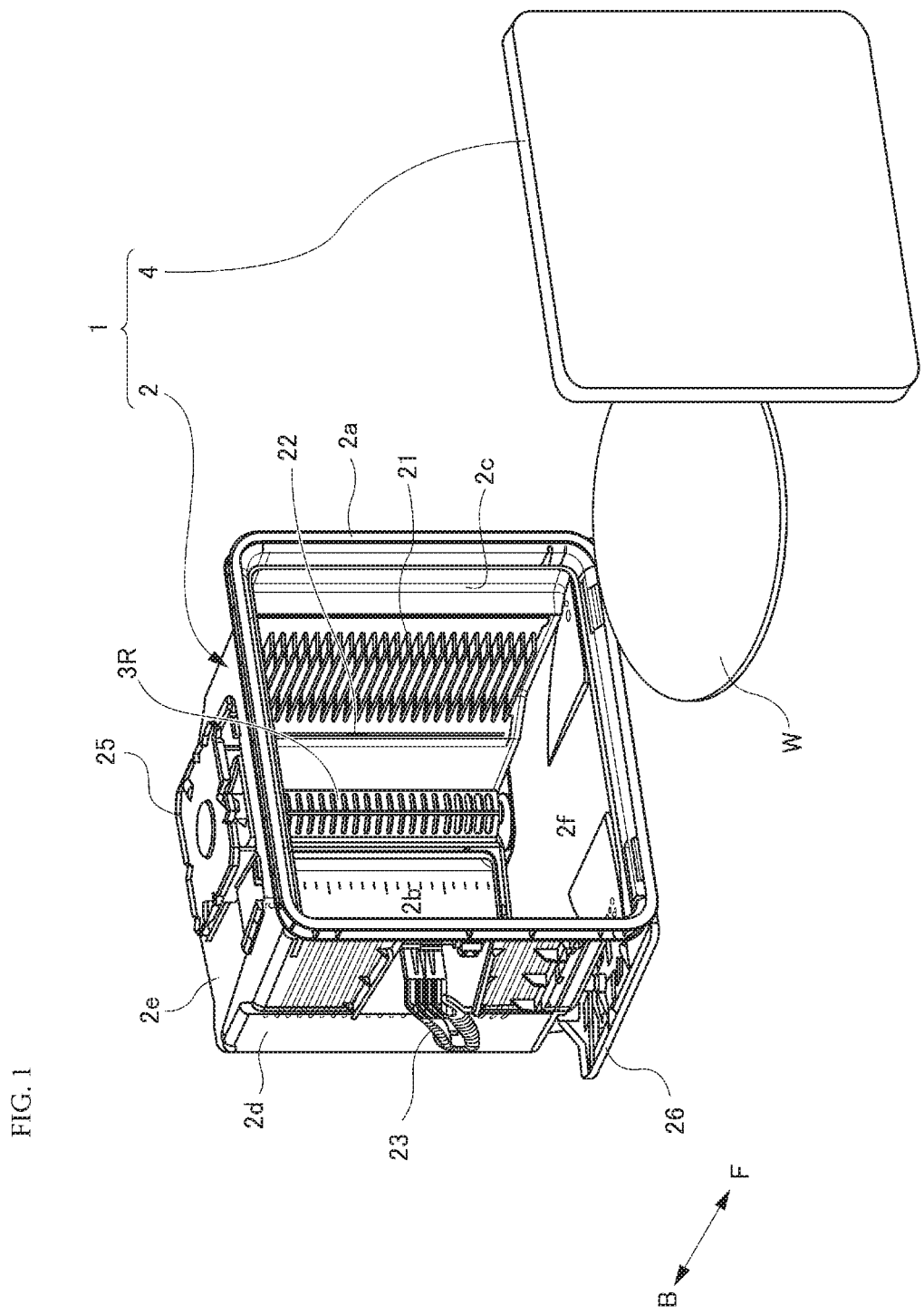
FIG. 1 is an exploded perspective view showing a substrate storage container according to an embodiment of the present invention.

Hereinafter, embodiments of the present invention will be described in detail with reference to the drawings. In the embodiments of the present specification, the same reference numerals are given to the same members throughout. In addition, in the drawings, the directions of front F and back (rear wall) B are indicated by solid arrows. Moreover, the left and right refer to the state as seen from the front F.

First Embodiment

Figure 2:
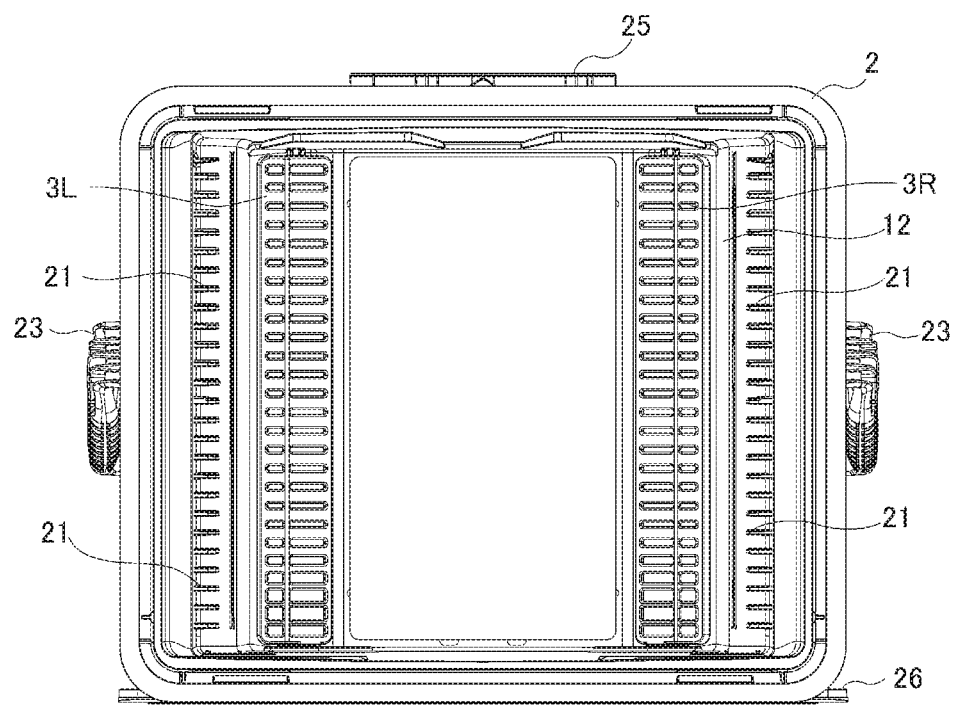
FIG. 2 is a front view of the container body.
Figure 3:
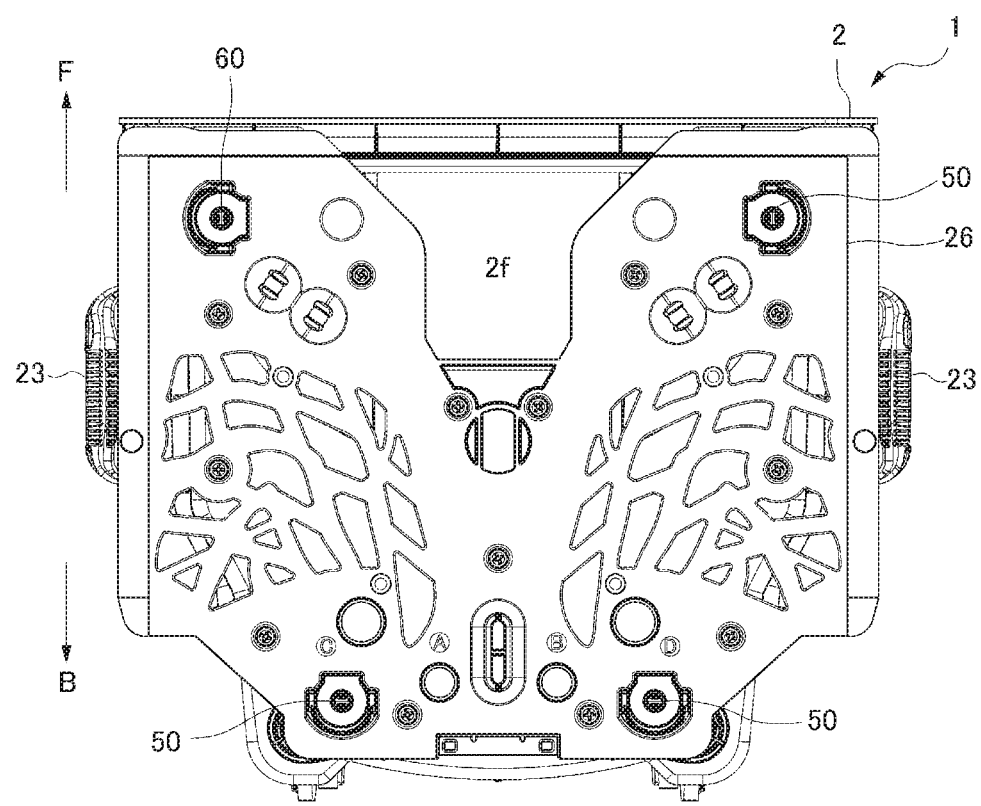
FIG. 3 is a bottom view of the container body.
Figure 4:
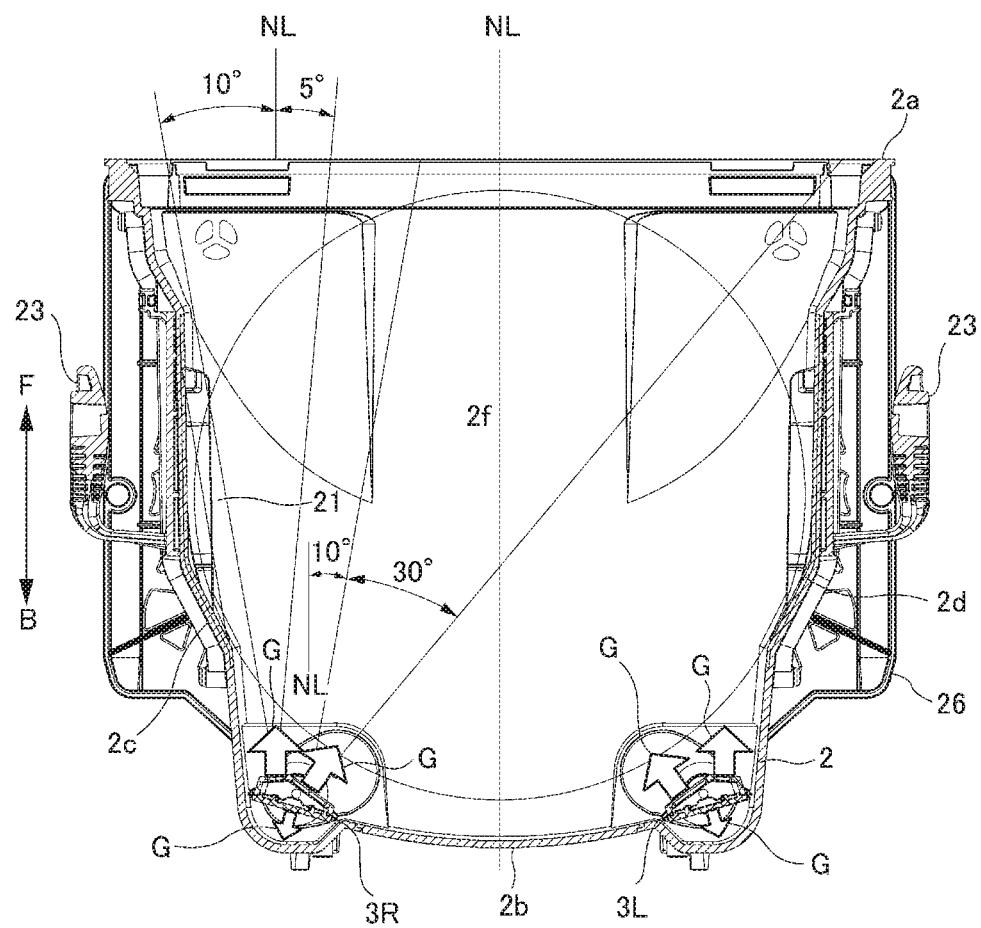
FIG. 4 is a sectional plan view of the container body.

The substrate storage container 1 of the first embodiment will be described. FIG. 1 is an exploded perspective view of a substrate storage container according to a first embodiment of the present invention; FIG. 2 is a front view of the container body; FIG. 3 is a bottom view of the container body, and FIG. 4 is a sectional plan view of the container body.

The substrate storage container 1 shown in FIG. 1 includes a container body 2 for storing a plurality of substrates W, and a lid 4 detachably attached to the opening of the container body 2. Some examples of the substrates W that can be stored in the substrate storage container 1 include a semiconductor wafer having a diameter of 300 mm or 450 mm, a glass mask, or the like.

The container body 2 is a so-called front open box type formed by a front opening frame 2a, a rear wall 2b, a right side wall 2c, a left side wall 2d, a top side 2e, and a bottom surface 2f.

The lid 4 is attached to the opening of the front opening frame 2a of the container body 2, and is attached so that a sealing gasket (not shown) faces the front opening frame 2a of the container body 2. When the lid 4 is attached to the container body 2, the sealing gasket is in close contact with the peripheral edge portion between the container body 2 and the lid 4, so as to maintain the airtightness of the internal space of the substrate storage container 1. The air in the internal space of the substrate storage container 1, whose airtightness is maintained, is replaced with a gas G via gas replacement units 3R and 3L to be described later.

On the rear wall 2b of the container body 2, protrusions projecting further towards the back B are formed on both the left and right sides (see FIG. 4). These protrusions function as leg portions when placed with the opening of the front F of the container body 2 facing upward. Further, on the central outer side of the rear wall 2b of the container body 2, a scale or the like indicating the number of substrates that can be stored is displayed (see FIG. 1).

In the area of the centers of the outside right side wall 2c and the left side wall 2d of the container body 2, grips 23 that can be used for a gripping operation are respectively attached.

A plurality of left and right pairs of support pieces 21 for horizontally supporting the stored substrates W are provided on the inside right side wall 2c and the left side wall 2d of the container body 2, and on the inner back B of the right side wall 2c and the left side wall 2d, and position regulating portions 22 are provided for regulating the insertion position of the substrates W when the substrates W are inserted toward the back B.

The pairs of left and right support pieces 21 are arranged at a predetermined pitch in the vertical direction, and each support piece 21 is formed in an elongated plate shape for supporting the peripheral edges of the substrates W. In the present embodiment, the support pieces 21 are provided so as to be able to support 25 substrates W, but the maximum stored number of substrates W is not limited to 25.

Because the substrates W may be stored in a fully loaded state or a smaller number than the fully loaded state in the container body 2, as required, the storage positions may be changed, and the number stored and the storage state within the container body 2 depends on the usage of the substrate storage container 1. For example, a plurality of substrates W may be stored so as to be biased upward or downward or may be stored so as one is positioned in every other space.

A top flange 25 such as a robotic flange is attached to the outside of the top side 2e of the container body 2. The top flange 25 is used for transportation between processes, such as when being gripped by an overhead conveying vehicle at a semiconductor manufacturing factory, and/or is used for positioning in a lid opening/closing device such as a semiconductor processing apparatus.

On the outside of the bottom surface 2f of the container body 2, a bottom plate 26 for positioning and placing the container body 2 is attached.

Parts such as the container body 2 and the lid 4, as well as the grip 23, the top flange 25, and the bottom plate 26 are injection-molded with a resin molding material, or a combination of a plurality of parts are injection molded. Examples of the resin contained in the molding material include thermoplastic resins such as polycarbonate, cyclic olefin polymer, polyether imide, polyether ketone, polyether ether ketone, polybutylene terephthalate, polyacetal, liquid crystal polymer, or alloys thereof.

In addition, conductive substances composed of carbon fibers, carbon powders, carbon nanotubes, conductive polymers or the like, or antistatic agents such as anions, cations, nonionic additives or the like can be added as required to these resins. Further, an ultraviolet absorber or a reinforcing fiber for improving the rigidity can be added as necessary. The container body 2, the lid 4, the grip 23, the top flange 25, the bottom plate 26, and the like may be transparent, opaque or translucent, but the container body 2 and the lid 4 are preferably transparent.

Figure 5:
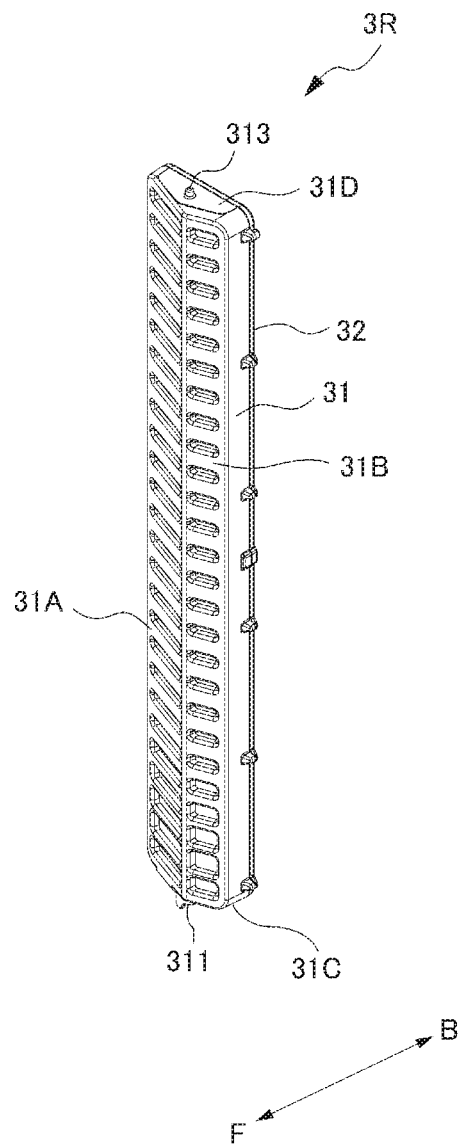
FIG. 5 is a perspective view of the gas replacement unit of the first embodiment.
Figure 7A:
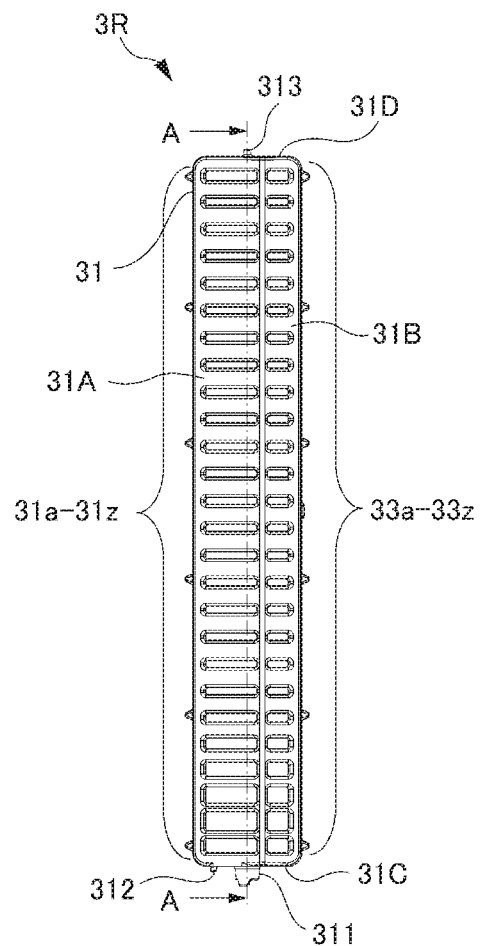
FIG. 7A is a front view.
Figure 7B:
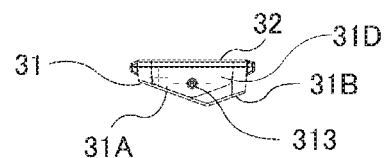
FIG. 7B is a plan view.
Figure 7C:
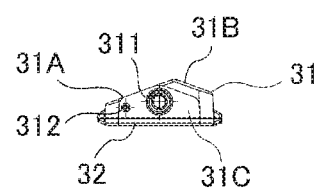
FIG. 7C is a bottom view.
Figure 7D:
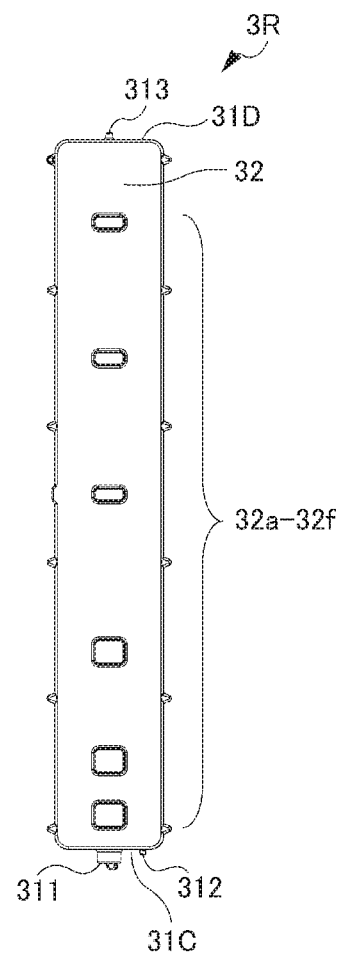
FIG. 7D is a rear view of the gas replacement unit of the first embodiment.
Figure 8:
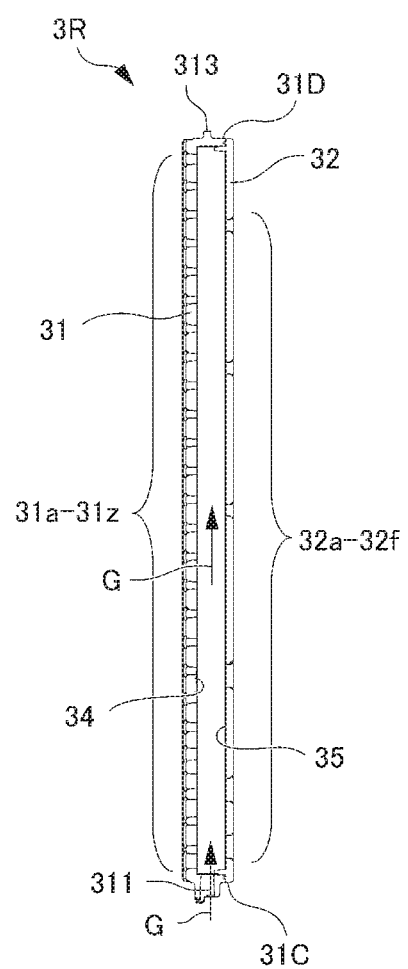
FIG. 8 is a sectional view taken along the line AA in FIG. 7A of the gas replacement unit of the first embodiment.

Subsequently, a structure in which the internal space of the substrate storage container 1 is replaced with a gas G by the gas replacement units 3R, 3L will be described. FIG. 5 is a perspective view of the gas replacement unit of the first embodiment, and FIG. 6 is an exploded perspective view of the gas replacement unit of the first embodiment. In FIG. 7A is a front view, FIG. 7B is a plan view, FIG. 7C is a bottom view, and FIG. 7D is a rear view of the gas replacement unit of a first embodiment. FIG. 8 is a cross-sectional view taken along the line AA in FIG. 7A of the gas replacement unit of the first embodiment. Moreover, FIGS. 5 to 8 show the as replacement unit 3R on the right side as viewed from the front F.

Because the gas replacement units 3R and 3L replace the internal space of the container body 2 with a gas G, the units are provided vertically in the longitudinal direction on both the left and right sides at the back B (near the rear wall 2b or the projecting portion) of the container body 2 so as to not interfere with the substrates W even when the substrates W are inserted (See FIGS. 1 and 2).

The gas replacement units 3R and 3L blow the gas G into the internal space of the container body 2. The gas G to be blown in may be an inert gas or dry air. Further, examples of the inert gas include nitrogen gas, argon gas or the like, but from a cost perspective, nitrogen gas is preferable.

Returning to FIG. 3, on the bottom surface 2f of the container body 2, three intake valves 50 and one exhaust valve 60 are provided. The intake valves 50 and the exhaust valve 60 are configured so as to suppress the deterioration of the surface of the stored substrates W by allowing the gas G to flow from outside of the substrate storage container 1 to the internal space or from the internal space outside, thereby eliminating the pressure difference between the inner space of the substrate storage container 1 and the outside.

Of these, two intake valves 50 are provided on the left and right sides at the back B of the bottom surface 2f. The lower portions of the gas replacement units 3R and 3L are connected to these two intake valves 50 so that the gas G is able to flow. In addition, one intake valve 50 and one exhaust valve 60 are provided on the left and right sides near the front F of the bottom surface 2f.

Figure 12:
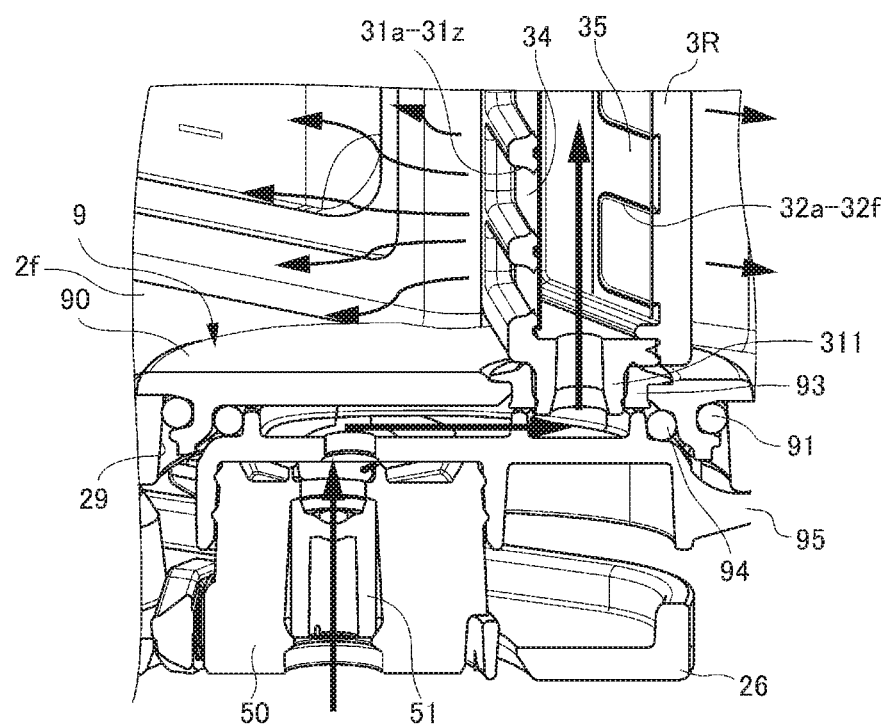
FIG. 12 is a cross-sectional perspective view showing a flow of gas flowing in from an intake valve.

Each intake valve 50 has a grommet 50a mounted in a recess formed in the bottom surface 2f of the container body 2, an air permeable filter member 51 attached to an end portion of the grommet 50a, and a check valve 52 (See FIG. 12).

The grommet 50a is formed of an elastic resin member such as an elastomer. The filter member 51 filters the supplied gas G so as to remove dust, and a nonwoven fabric filter or the like may be used. The check valve 52 is biased by the coil spring 53 in the direction of closing the valve, and is stored in the valve housing 54 (see FIG. 12).

Furthermore, the exhaust valve 60 has a check valve (not shown), and, for example, by attaching a humidity (or concentration) sensor, measuring the humidity (or concentration) of the internal space of the substrate storage container 1 after replacing the internal space of the substrate storage container 1 with the gas G is possible, as well as managing whether the replacement of the gas G in the internal space of the substrate storage container 1 has been performed normally is also possible.

The gas replacement units 3R and 3L will be described in more detail. However, as shown in FIG. 2, because the gas replacement unit 3L has the same shape and structure, except that it is bilaterally symmetrical with the gas replacement unit 3R, its explanation will be omitted.

The gas replacement unit 3R shown in FIG. 5 includes a housing member 31 and a cover member 32 and is formed in a substantially pentagonal prism shape, but the shape is not limited thereto. Further, the gas replacement unit 3R may be formed of the same resin such as that of the container body 2, or may be formed of a different resin.

The housing member 31 is formed in a box shape in which one side is open (in the direction of the back B) in order to store the gas G, and the cover member 32 is formed in a plate shape and is installed so as to cover this open surface by a locking means (engaging means) such as a hook or by welding means such as ultrasonic waves (See FIG. 6). A space for storing the gas G is formed by the housing member 31 and the cover member 32.

Here, the housing member 31 has two surfaces 31A, 31B of different sizes and the surfaces intersect at a predetermined angle. The intersection angle between the surface 31A and the surface 31B is in the range of 120° to 170° in the interior angle. Further, the area of the surface 31A is larger than the area of the surface 31B.

A cylindrical connecting member 311, into which the gas G from the intake valve 50 flows, protrudes from the lower surface 31C of the housing member 31. In the vicinity of the connecting member 311, a rotation stopping protrusion 312, for positioning the rotational direction, is formed which stops the rotation of the gas replacement unit 3R in the left-right direction (See FIGS. 7A-7D). On the other hand, on the upper surface 31D of the housing member 31, a cylindrical positioning protrusion 313, for positioning and fixing to the container body 2, is formed.

In the present embodiment, the surface 31A, the surface 31B, the lower surface 31C and the upper surface 31D of the housing member 31 are integrally molded, but at least one of either the lower surface 31C or the upper surface 31D may be molded separately.

As shown in FIG. 7A, on the surface 31A of the housing member 31, twenty-six horizontal elongated substantially rectangular blowout holes are formed as a first group of blowout holes 31a, 31b, 31c . . . 31x, 31y, 31z (hereinafter referred to as "first group blowout holes 31a-z" as necessary) in the vertical direction (longitudinal direction) in order from the top.

On the surface 31B of the housing member 31, twenty-six horizontal elongated substantially rectangular blowout holes are formed as a third group of blowout holes 33a, 33b, 33c . . . 33x, 33y, 33z (hereinafter referred to as "third group blowout holes 33a-z" as necessary) in the vertical direction (longitudinal direction) in order from the top.

By forming the first group blowout holes 31a-z and third group blowout holes 33a-z on the surfaces 31A and 31B, respectively, which intersect at a predetermined angle, the gas G can be blown in differently, and the gas G easily diffuses into the internal space of the substrate storage container 1.

The opening height of the uppermost first group blowout hole 31a is slightly larger than the opening height of the second first group blowout hole 31b; that is, the opening area of first group blowout hole 31a is slightly larger than the opening area of first group blowout hole 31b. Further, the opening areas from the first group blowout hole 31b to first group blowout hole 31u are all equal; each of the opening areas starting from first group blowout hole 31v to first group blowout hole 31y gradually becomes larger than that of the opening area of first group blowout hole 31u; and the opening area of first group blowout hole 31z is smaller than the opening area of first group blowout hole 31y. Also, the same applies to the third group blowout holes 33a-z.

Then, the lowermost first group blowout hole 31z and third group blowout hole 33z are located below the substrates W supported by the lowermost support piece 21 of the container body 2. However, the number of holes like the first group blowout holes 31z and the third group blowout holes 33z that are below the lowermost substrate W are not limited to one but may be multiple.

For this setup, in the first group blowout holes 31a-z and the third group blowout holes 33a-z, the opening area for each of the first group blowout hole 31a and the third group blowout hole 33a in the uppermost stage is larger; thereby, even if the space formed between the uppermost substrate W and the inner surface of the top side 2e of the container body 2 is larger than the space formed between the substrate W of the other stage and the substrate W of the adjacent stage, the air volume of the gas G blown out from the uppermost first group blowout hole 31a increases, and the humidity or concentration of the gas G in the space above the substrate W does not differ depending on the position (level) of the substrate W and is in a uniform state.

Furthermore, because the first group blowout holes 31a-z and the third group blowout holes 33a-z each have a larger opening area on the lower side, then even if the straightness of the gas G supplied from below is high, the gas G is still uniformly blown from the lower side to the upper side of the first group blowout holes 31a-z and the third group blowout holes 33a-z. Also, because the first group blowout hole 31z and the third group blowout hole 33z are also formed under the lowermost substrate W, and since the gas G is also blown out between the lowermost substrate W and the bottom surface 2f, then even if any downflow air in the clean room intrudes into the inside from the opening of the front F of the container body 2, the downflow air in the clean room does not flow more than necessary due to the gas G being blown toward the front F over the upper surface of the bottom surface 2f.

Moreover, as shown in FIG. 7D, in the cover member 32, six substantially rectangular or square blowout holes are formed as a second group of blowout holes 32a, 32b . . . 32e, 32f (hereinafter referred to as "second group blowout holes 32a-f", as necessary) in the vertical direction in order from the top. The height position of the uppermost second group blowout hole 32a is substantially the same as the height position of the first group blowout hole 31c. Hereinafter, the second group blowout hole 32b and the first group blowout hole 31h coincide with each other at substantially the same height. The second group blowout hole 32c and the first group blowout hole 31m coincide with each other at substantially the same height. The second group blowout hole 32d and the first group blowout hole 31s coincide with each other at substantially the same height. The second group blowout hole 32e and the first group blowout hole 31w coincide with each other at substantially the same height. The second group blowout hole 32f and the first group blowout hole 31y coincide with each other at substantially the same height.

Here, the ratio of the total opening area S1, S2, S3 for each of the first group blowout holes 31a-z, second group blowout holes 32a-f, and third group blowout holes 33a-z can be adjusted so that variations in humidity decreases among the plurality of substrates W stored in the container body 2. By adjusting the blowout holes of the first group blowout holes 31a-z, the second group blowout holes 32a-f, and third group blowout holes 33a-z which are provided in the housing member 31 and the cover member 32 in a different manner or by closing any appropriate blowout holes, the opening area can be adjusted.

Returning to FIG. 4, since the gas replacement units 3R, 3L are provided on the left and right sides at the back B (the rear wall 2b or the vicinity of the protrusions) of the container body 2 as described above, in order to uniformly diffuse the discharged gas G into the internal space of the substrate storage container 1, essentially, the gas is blown out from the first group blowout holes 31a-z and the third group blowout holes 33a-z toward the front F, and the air will then be replaced with gas G. At this time, since there is air also from the rear wall 2b to the right side wall 2c or the left side wall 2d behind the position where the first group blowout holes 31a-z and the third group blowout holes 33a-z are provided, the gas G is preferably blown out from the second group blowout holes 32a-f toward the back B.

The space on the front F where the first group blowout holes 31a-z and the third group blowout holes 33a-z are provided is considerably larger than the space at the back B where the first group blowout holes 31a-z and the third group blowout holes 33a-z are provided; thereby, with respect to the total opening area S1 of the first group blowout holes 31a-z and the total opening area S3 of the third group blowout holes 33a-z facing the front F, making them larger than the total opening area S2 of the second group blowout holes 32a-f facing the back B is preferable.

In addition, as described above, the gas replacement units 3R and 3L basically blow the gas G toward the front F, but are provided in the vicinity of the right side wall 2c or the left side wall 2d; thereby, the amount of gas G directed to the front F along the right side wall 2c or the left side wall 2d may be small; however, the gas G directed toward the center of the container body 2 may be larger. Therefore, making the total opening area S1 of the first group blowout holes 31a-z larger than the total opening area S3 of the third group blowout holes 33*a-z* is preferable.

Based on this, the ratio of the total opening area of S1, S2, and S3 for each of the first group blowout holes 31*a-z*, the second group blowout holes 32*a-f*, and the third group blowout holes 33*a-z*, respectively, may be S1:S2:S3=3:1:2, or the like.

Returning to FIG. 6, an air permeable filter member 34 is provided inside the housing member 31, and similarly, inside the cover member 32, an air permeable filter member 35 is also provided. Examples of the filter members 34, 35 include a nonwoven fabric filter or the like.

Then, the gas G is introduced via the cylindrical connecting members 311 into the space formed by the housing member 31 and the cover member 32, and is stored. The stored gas G passes through the filter members 34, 35, and is blown out from the first group blowout holes 31*a-z*, the second group blowout holes 32*a-f*, and the third group blowout holes 33*a-z* into the internal space of the container body 2.

Figure 10:
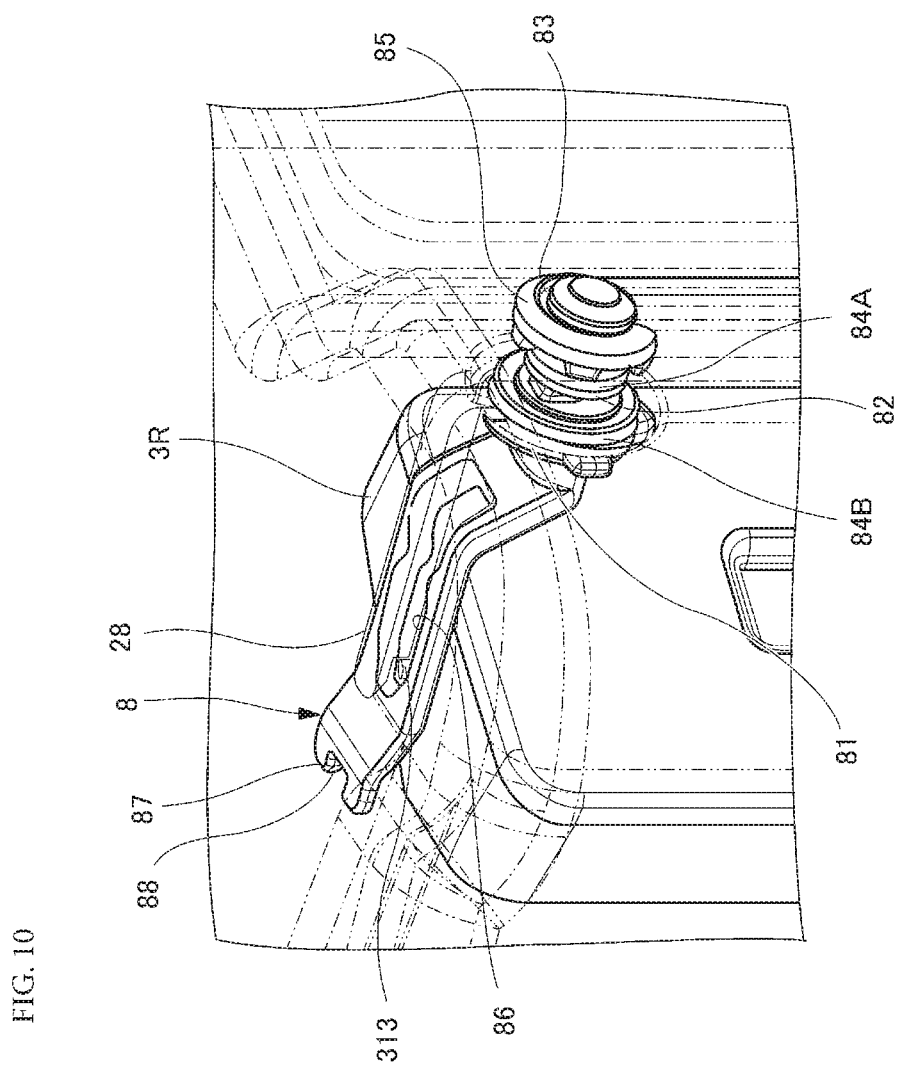
FIG. 10 is an enlarged perspective view of an upper attachment portion of the gas replacement unit.
Figure 11A:
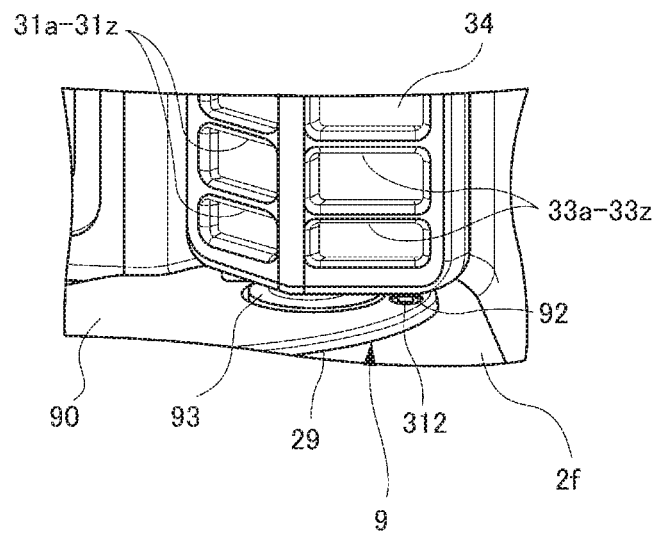
FIG. 11A is an enlarged view of a lower attachment portion of a gas replacement unit, and FIG. 11B a cross-sectional perspective view.
Figure 11B:
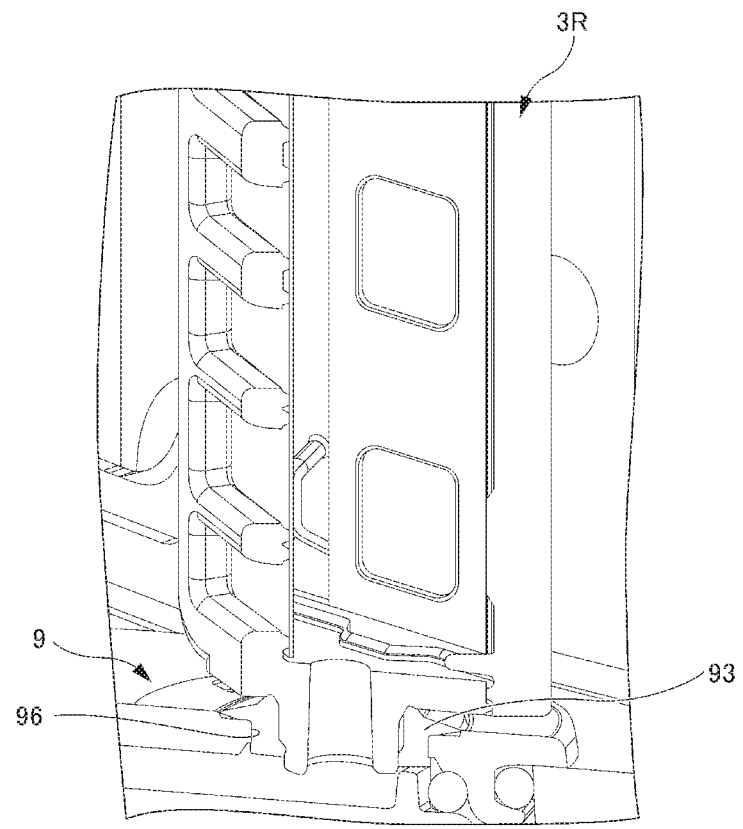

A method of attaching the gas replacement unit 3R to the container body 2 will be described. FIG. 9A is a schematic front view, FIG. 9B is an enlarged perspective view of the upper attachment portion of the gas replacement unit, and FIG. 9C is an enlarged perspective view of the lower attachment portion of the gas replacement unit. FIG. 10 is an enlarged perspective view of an upper attachment portion of the gas replacement unit. FIG. 11A is an enlarged view of a lower attachment portion of a gas replacement unit, and FIG. 11B is a cross-sectional perspective view.

The gas replacement unit 3R is attached to the container body 2 by a position fixing member 8 and an offset member 9. Specifically, the upper part of the gas replacement unit 3R is attached to the position fixing member 8, and the lower part of the gas replacement unit 3R is attached to the offset member 9.

Therefore, circular through holes 27 are formed in the left and right sides of the rear wall 2*b* of the container body 2 in order to fix the position fixing member 8, and also a stopper 28 is formed above the through hole 27. On the other hand, attachment holes 29 are formed on the left and right sides of the bottom surface 2*f* of the container body 2 in order to fix the offset member 9. The attachment holes 29 are formed in a substantially elliptical shape instead of a circular shape by connecting a large circle and a small circle.

The position fixing member 8 shown in FIG. 10 has an elongated shape, one end side of which is formed in a substantially plate shape and the other end side thereof is formed by a rectangular shaft. Three disk-shaped flanges 81, 82, 83 are formed toward the other end side around this shaft. The shaft end flange 83 and the middle flange 82 are smaller than the diameter of the through hole 27 in the rear wall 2*b* and are inserted into the through hole 27. A small-diameter stepped portion is formed in the middle flange 82, and an O-ring 84A is fitted therein. A small-diameter stepped portion is also formed in the inner flange 81, and an O-ring 84B is fitted therein. The inner flange 81 and the O-ring 84B are formed larger than the diameter of the through hole 27, and when the other end side of the position fixing member 8 is inserted into the through hole 27, since the O-ring 84B is sandwiched between the container body 2 and the flange 81, the gas G does not leak out.

After inserting the position fixing member 8 into the through hole 27, a rectangular shaft is positioned between the shaft end flange 83 and the container body 2 with a C-ring 85 inserted in between and in which the inner surface of the C-ring forms a rectangular shape and its outer diameter is larger than the through hole 27; the position fixing member 8 is fixed to the container body 2 through the through hole 27. Specifically, sealing is enhanced by inserting the C-ring 85 while squashing the O-ring 84B between the flange 81 and the container main body 2 and while pulling the shaft end flange 83 toward the outside.

Further, one end of the position fixing member 8 has a plate shape bent upward, and an elongated slit 86 is formed. The positioning protrusion 313 and the stopper 28 of the housing member 31 are fitted into the slit 86. The end 87 is further curved toward the top, and a U-shaped notch 88 is further formed at the tip thereof.

An offset member 9 shown in FIGS. 11A-11B is provided between the offset plate presser 90 positioned on the inside of the bottom surface 2*f* and the offset plate 95 positioned on the outside of the bottom surface 2*f*, and is assembled via an O-ring 94 (see FIG. 12) so that a gap through which the gas G can flow is formed.

The offset plate presser 90 is formed with a recess 92 into which the rotation stopping protrusion 312 of the housing member 31 fits, and when the rotation stopping protrusion 312 fits into the recess 92, the direction and position of the rotating gas replacement unit 3R are fixed. An insertion hole 96 is formed in the offset plate presser for inserting the connecting member 311 of the gas replacement unit 3R, and the connecting member 311 is inserted through a packing 93. In the attachment hole 29, the offset plate presser 90 is fitted via an O-ring 91 (see FIG. 12).

A concave portion into which the intake valve 50 is fitted is formed in the offset plate 95 so that the center of the intake valve 50 is located at a position displaced from the center position of the packing 93 as seen in the plan view (see FIG. 12).

With such a configuration, in the gas replacement unit 3R, the lower connecting member 311 is first attached to the offset member 9, and thereafter, the upper positioning protrusion 313 is attached to the position fixing member 8 and attached to the container body 2.

More specifically, because the connecting member 311 at the lower part of the gas replacement unit 3R is inserted into the packing 93 and inclined, by pushing the positioning protrusion 313 on the upper portion of the gas replacement unit 3R from the end 87 toward the slit 86, the position fixing member 8 curves, and the positioning protrusion 313 fits into the slit 86. At the same time, the positioning protrusion 313 also comes into contact with the stopper 28, so that its position in the slit 86 is fixed, and the upper part of the gas replacement unit 3R is fixed in a position.

Finally, the flow of the gas G will be described. FIG. 12 is a cross-sectional perspective view showing the flow of the gas flowing from the intake valve. The flow of the gas G is indicated by arrows. In FIG. 12, the gas G which is introduced at a high pressure from the intake valve 50 passes through the filter member 51, and flows through the gap between the offset plate presser 90 and the offset plate 95, and is directed to the connection portion between the offset plate presser 90 at the back B and the connecting member 311 at the lower portion of the gas replacement unit 3R.

Thereafter, the gas G is blown out from the first group blowout holes 31*a-z*, the third group blowout holes 33*a-z* and the second group blowout holes 32*a-f* while advancing into the storage space of the gas replacement unit 3R (see FIG. 8). At this time, the gas G is blown out in three different directions, i.e. in the direction toward the center of the front F, in the direction toward the right side wall 2*c* and in the direction toward the rear wall 2*b* at the back B (see FIG. 4).

Here, the direction of the gas G blown out from the first group blowout holes 31a-z toward the vicinity of the center on the front F side of the container body 2, and the direction of the gas G blown out from the third group blowout holes 33a-z toward the right side wall 2c or the left side wall 2d of the container body 2 will be specifically described.

The advancing direction of the blowout openings of the first group blowout holes 31a-z or the third group blowout holes 33a-z, i.e. the normal line passing through the center of the surface 31A or the surface 31B where the first group blowout holes 31a-z or the third group blowout holes 33a-z are formed does not intersect with the right side wall 2c or the left side wall 2d and is preferably in a range reaching the opening of the front opening frame 2a of the container body 2. More preferably, in the case of the gas replacement unit 3R, the normal line to the surface 31A is in the range of 10° to 40° with respect to the normal line NL (perpendicular) from the opening of the front opening frame 2a of the container body 2, and the normal line of the surface portion 31B is in the range of 5° from the center side to 10° on the right side wall 2c, with the normal line NL (perpendicular) from the opening of the front opening frame 2a of the container body 2 therebetween. In the case of the gas replacement unit 3L, it is symmetrical with the gas replacement unit 3R.

The surface 31A and the surface 31B (or the first group blowout holes 31a-z and the third group blowout holes 33a-z) are formed so as to be within such a range, and by arranging the gas replacement units 3R, 3L inside the container body 2, the gas G blown out from the respective blowout holes does not collide with the right side wall 2c or the left side wall 2d of the container body 2 to be reflected. Therefore, since turbulence does not occur in the gas flow of the gas G, it is possible to quickly and reliably replace the internal space of the container body 2 with the gas G.

When the lid 4 is attached to the container body 2, the gas G is supplied to the container body 2 at a high pressure, and when the interior space is filled, the gas G flows out of the container body 2 from the exhaust valve 60 shown in FIG. 3. Due to this outflow of air, the internal space of the substrate storage container 1 is replaced with the gas G which is a purge gas.

On the other hand, when the lid 4 is not attached, downflow air from an external device such as a clean room (not shown) flows in from the front F of the container body 2, but the internal space of the substrate storage container is replaced with the gas G which is a purge gas while resisting this air.

As described above, in the substrate storage container 1 according to the first embodiment of the present invention comprises a container body 2 capable of storing a plurality of substrates W, intake valves 50 for supplying the gas G from outside of the container body 2 to the internal space, and gas replacement units 3R and 3L for blowing the gas G supplied from the intake valves 50 into the internal space of the container body 2, wherein the container body 2 is formed in a front open box, wherein the substrate storage container 1 in which the intake valves 50 are attached to the back B of a bottom surface 2f, wherein the gas replacement units 3R and 3L each include a housing member 31 that stores the gas G supplied from the intake valve 50, and a cover member 32 that covers the opening of the housing member 31, wherein the opening of the housing member 31 is oriented toward the back B of the container body 2 and the lower part of the housing member 31 is connected to the intake valves 50, wherein the housing member 31 has a plurality of first blowout holes 31a, 31b, 31c, . . . 31x, 31y, 31z for blowing the stored gas G in the direction of the front F of the container body 2, and wherein the cover member 32 has a plurality of second blowout holes 32a, 32b, 32c, 32d, 32e, 32f which blow out in the backward direction opposite to the blowing direction of the first blowout holes 31a, 31b, 31c . . . 31x, 31y, 31z.

As a result, the gas G blown out from the first group blowout holes 31a-z of the gas replacement units 3R, 3L flows from the vicinity of the center of the container body 2 toward the front F, and the gas G blown out from the second group blowout holes 32a-f collides with the rear wall 2b of the container body 2, going right and left, as well as up and down, and flowing through the gap between the container body 2 and the gas replacement units 3R and 3L and flowing toward the front F. Therefore, even when the storage state of the substrates W changes, providing a substrate storage container 1 having smaller variations in humidity or concentration among the substrates W is possible.

In the present embodiment, at least one of the gas replacement units 3R, 3L blows the gas G in three different directions. As a result, because the gas replacement units 3R and 3L are provided with the third group blowout holes 33a-z for blowing gas G also in the front F direction along the right side wall 2c or the left side wall 2d in addition to the central direction and the rear wall 2b direction of the container body 2, the gas G can be blown out into the entire internal space of the container main body 2.

In the present embodiment, at least one of the upper portion and the central portion of the housing member 31 is positioned and fixed by using the through holes 27 formed in the rear wall 2b of the container body 2. Thereby, since the gas replacement units 3R, 3L are attached using the position fixing member 8 that can be easily attached to and detached from the through holes 27, the gas replacement units 3R, 3L can be easily attached or detached from the container main body 2. Even when cleaning the container body 2, the gas replacement units 3R, 3L can easily be removed and every corner of the interior of the container body 2 can be cleaned. In addition, the removed gas replacement units 3R, 3L can easily be cleaned.

In the present embodiment, at least one of the first group blowout holes 31a-z is positioned lower than the lowest level substrate W stored in the container main body 2. This also allows the gas G to flow evenly under the lowermost substrate W. Therefore, even when the storage state of the substrates W changes, providing a substrate storage container 1 having smaller variations in humidity among the substrates W is possible.

In the present embodiment, the gas replacement units 3R and 3L include air permeable filter members 34, 35 inside the housing member 31 and the cover member 32. As a result, even if dust is present in the supplied gas G, because the dust is captured by the filter members 34, 35 and does not blow into the container body 2, the internal space of the substrate storage container 1 does not become contaminated.

In the present embodiment, the gas G is nitrogen gas or dry air. As a result, since the internal space of the substrate storage container 1 is kept inactive or has low humidity, the surfaces of the substrates W do not become degenerated.

Second Embodiment

Hereinafter, a second embodiment of the substrate storage container 1 will be described. The substrate storage container 1 of the second embodiment is the same as that of the substrate storage container 1 of the first embodiment except that the gas replacement units 3R and 3L are different from the gas replacement units 3R and 3L of the first embodiment. Therefore, in the second embodiment, those features which are the same as in the first embodiment will not be described, and those features (gas replacement units 3R, 3L) which are different from the first embodiment will be described.

Figure 13:
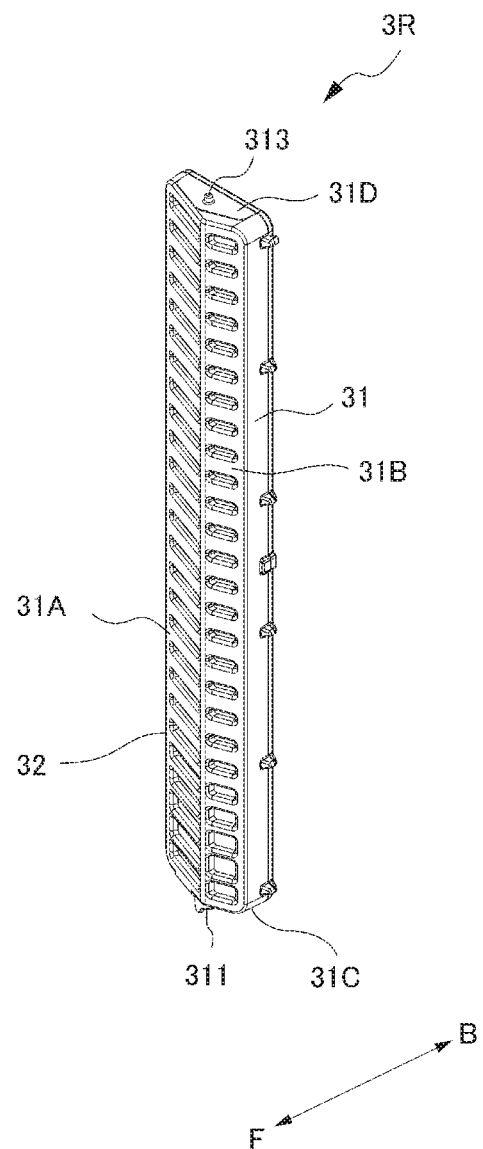
FIG. 13 is a perspective view of a gas replacement unit according to a second embodiment.
Figure 14:
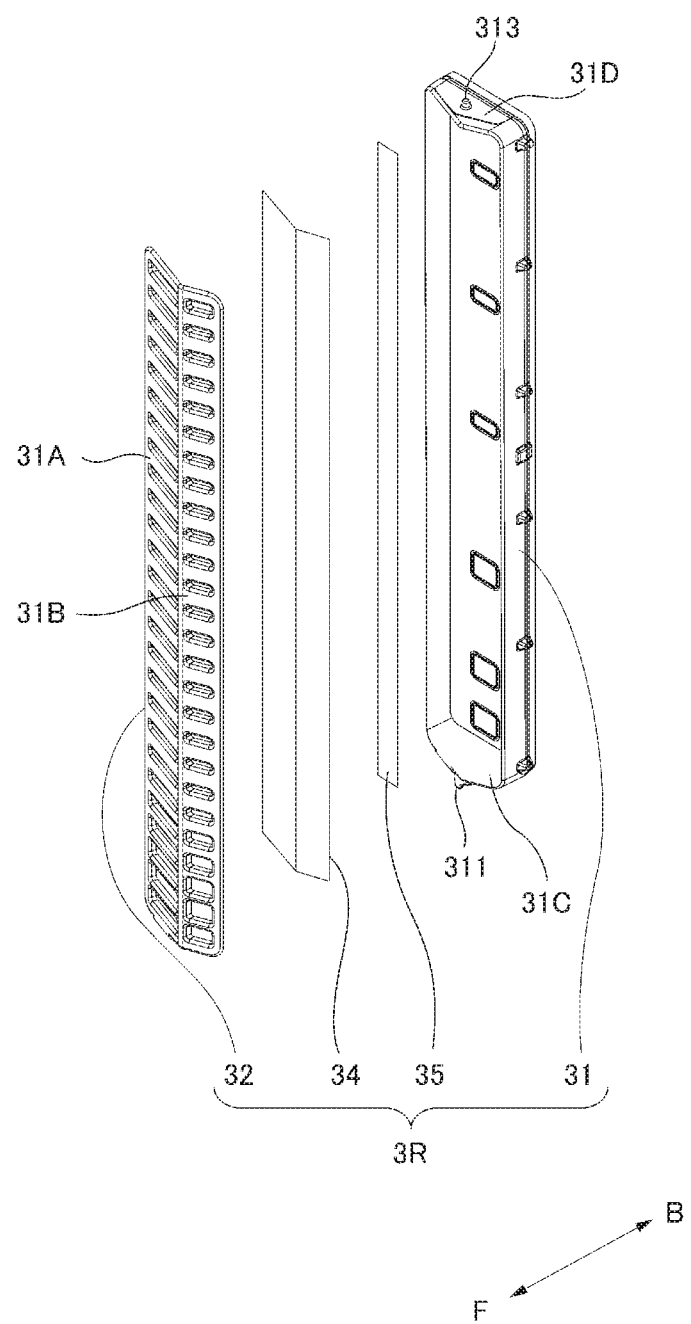
FIG. 14 is an exploded perspective view of a gas replacement unit according to the second embodiment.
Figure 15A:
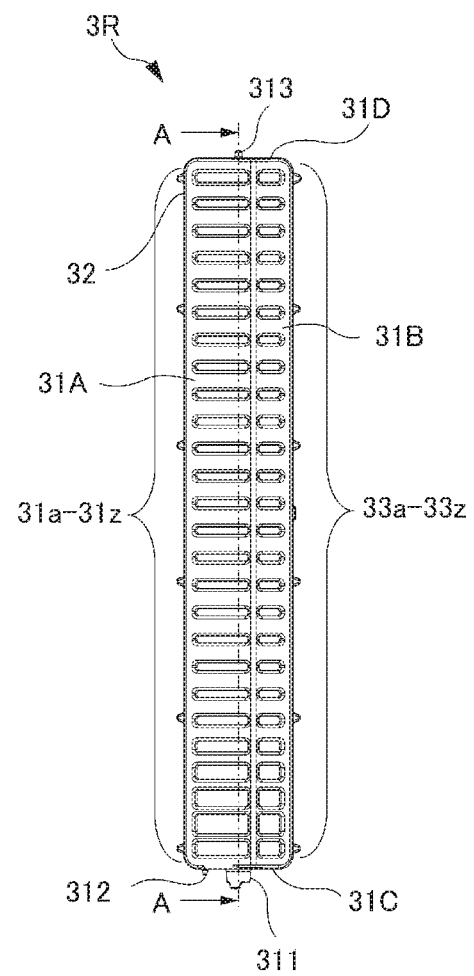
FIG. 15A is a front view.
Figure 15B:
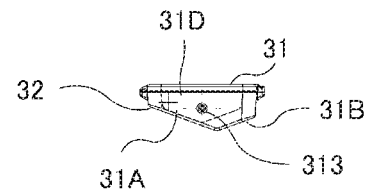
FIG. 15B is a plan view.
Figure 15C:
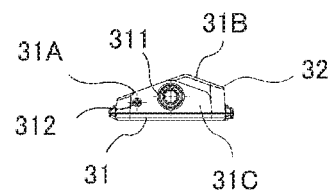
FIG. 15C is a bottom view.
Figure 15D:
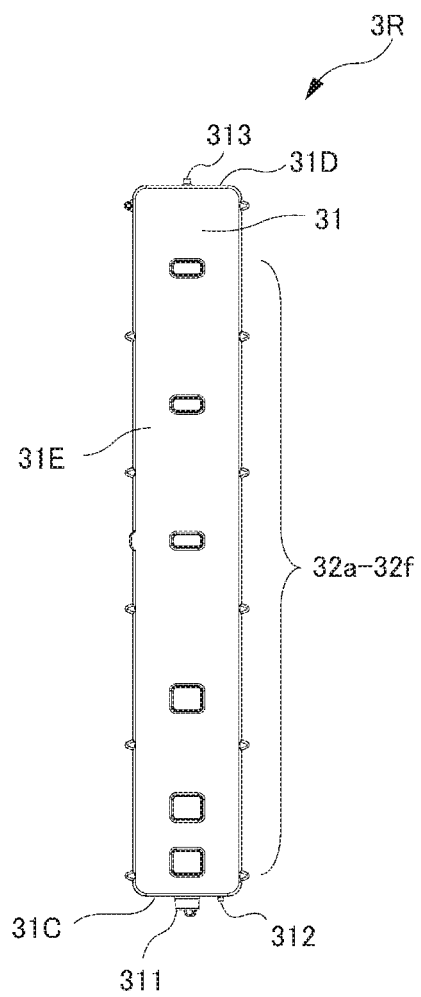

As such, the gas replacement units 3R and 3L of the second embodiment will be described. FIG. 13 is a perspective view of a gas replacement unit of the second embodiment, and FIG. 14 is an exploded perspective view of a gas replacement unit of the second embodiment. FIG. 15A is a front view, FIG. 15B is a plan view, FIG. 15C is a bottom view, and FIG. 15D is a rear view of the gas replacement unit of the second embodiment. Moreover, FIG. 13 and FIG. 14 show the gas replacement unit 3R on the right side as viewed from the front F.

Like with the first embodiment, the gas replacement unit 3L has the same shape and structure, except that it is bilaterally symmetrical with the gas replacement unit 3R, so an explanation will be omitted.

The gas replacement unit 3R shown in FIG. 13 includes a housing member 31 and a cover member 32 and is formed in a substantially pentagonal prism shape, but the shape is not limited thereto. Further, the gas replacement unit 3R may be formed of the same resin as the container body 2 or the like, or may be formed of a different resin.

The housing member 31 is formed in a box shape in which one side is open (the direction of the front F), and a cover member 32 is attached by a locking means (engaging means) such as a hook or a welding means such as ultrasonic waves so as to cover this open face (see FIG. 14). A space for storing the gas G is formed by the housing member 31 and the cover member 32.

Here, the cover member 32 is formed in an L-shaped plate shape having two surfaces 31A and 31B having different sizes intersecting at a predetermined angle (see FIG. 14). The intersection angle between the surface 31A and the surface 31B is in the range of 120° to 170° in the interior angle. Further, the area of the surface 31A is formed so as to be larger than the area of the surface 31B. Similarly to the first embodiment, first group blowout openings 31a, 31b, 31c, . . . 31x, 31y, 31z and third group blowout holes 33a, 33b, 33c . . . 33x, 33y, 33z are respectively formed in the surface 31A and the surface 31B of the cover member 32.

A cylindrical connecting member 311 into which the gas G from the intake valves 50 flow protrudes from the lower surface 31C of the housing member 31. In the vicinity of the connecting member 311, rotation of the gas replacement unit 3R in the left-right direction is stopped, and a rotation stopping protrusion 312 for fixing the rotational direction is formed (see FIG. 15). On the other hand, on the upper surface 31D of the housing member 31, a cylindrical positioning protrusion 313 for positioning and fixing to the container body 2 is formed.

The connecting member 311, the rotation stopping protrusion 312, and the positioning protrusion 313 of the second embodiment have the same function as the connecting member 311, the rotation stopping protrusion 312, and the positioning protrusion 313 of the first embodiment.

In the main body 31E of the housing member 31, as shown in FIG. 15(d), six substantially rectangular or square blowout holes are formed as the second group blowout holes 32a, 32b, . . . 32e, 32f in order from the top in the vertical direction (longitudinal direction). The height position of the uppermost second group blowout hole 32a is substantially the same as the height position of the first group blowout hole 31c; the second group blowout hole 32b and the first group blowout hole 31h coincide with each other at substantially the same height; the second group blowout hole 32c and the first group blowout hole 31m coincide with each other at substantially the same height; the second group blowout hole 32d and the first group blowout hole 31s coincide with each other at substantially the same height; the second group blowout hole 32e and the first group blowout hole 31w coincide with each other at substantially the same height; and the second group blowout hole 32f and the first group blowout hole 31y coincide with each other at substantially the same height.

In the second embodiment, the lower surface 31C, the upper surface 31D, and the main body portion 32E are integrally molded in the housing member 31, but at least one of the lower surface 31C or the upper surface 31D may be separately molded.

(Modifications)

In the gas replacement units 3R, 3L of the above embodiment, the opening area, number, and arrangement of the first group blowout holes 31a-z, the third group blowout holes 33a-z, and the second group blowout holes 32a-f are not limited to the above embodiments, and the amount of blown air blown downward may be increased so that it can oppose the air from the outside such as the downflow air blown along the upper surface of the bottom surface 2f.

Further, by selectively blocking or drilling the second group blowout holes 32a-f, the ratio of the blown air volume to the front F and the back B is able to be adjusted. Moreover, by changing the position of the recess of the offset member 9, the direction of the gas replacement units 3R, 3L may be changed. Alternatively, the intersection angle of the two surfaces 31A, 31B of the housing member 31 may be changed, or the area may be changed to adjust the blowout direction and/or the ratio of the blowout airflow rate. These changes can be dealt with by using inserts in the molding die.

In addition, the housing member 31 may be positioned and fixed not at the upper portion but at the center portion, or may be positioned and fixed at the upper portion and the central portion. At this time, the position of the through hole 27 formed in the rear wall 2b is appropriately changed, and the shape of the position fixing member 8 is appropriately changed.

In the above embodiment, in addition to the gas replacement units 3R and 3L, a plurality of other gas replacement units may be provided, or alternatively, any one of the gas replacement units 3R and 3L may be used. In addition, the gas replacement units 3R, 3L are not limited to the two positions on the left and right sides at the back B, and may be arranged in the region of the center of the back B if there is a region in that area that does not interfere with the substrates W.

Although the preferred embodiments of the present invention have been described in detail above, the present invention is not limited to the above-described embodiments, and various modifications and changes are possible within the scope of the gist of the present invention described in the claims.

The invention claimed is:

1. A substrate storage container comprising:
   a container body capable of storing a plurality of substrates;
   at least one intake valve for supplying gas to an internal space of the container body; and
   at least one gas replacement unit which blows the gas supplied from the at least one intake valve into the internal space of the container body, wherein the container body is formed into a front opening box and the at least one intake valve is attached to a rear of a bottom surface of the front opening box;

wherein each of the at least one gas replacement unit comprises a housing member which stores the gas supplied from the at least one intake valve, and a cover member which covers an opening of the housing member, wherein the opening of the housing member is oriented in a rearward direction of the container body and a lower portion of the housing member is connected to the at least one intake valve, wherein the housing member has a plurality of first blowout holes for blowing the stored gas toward a front of the container body, and wherein the cover member has a plurality of second blowout holes for blowing the stored gas toward the rearward direction, wherein the plurality of first blowout holes are formed such that an opening area of a first one of the first blowout holes that is at a highest position is larger than an opening area of a second one of the first blowout holes that is at a lower side of the first one of the first blowout holes, and an opening area of a third one of the first blowout holes that is at a lower side of the second one of the first blowout holes is larger than an opening area of the second one of the first blowout holes.

2. The substrate storage container according to claim 1, wherein the cover member is formed in a flat plate shape so that the gas is blown out in one direction toward the rearward direction, while the gas is blown out in at least two different directions through the housing member toward the front of the container body.

3. The substrate storage container according to claim 1, wherein at least one of the first blowout holes is positioned lower than a lowermost level of the substrates stored in the container body.

4. The substrate storage container according to claim 1, wherein the at least one gas replacement unit includes at least one air permeable filter member inside the housing member and the cover member.

5. The substrate storage container according to claim 1, wherein the plurality of first blowout holes at a middle part are formed such that an opening area of each of the first blowout holes is substantially equal.

6. The substrate storage container according to claim 1, wherein the plurality of first blowout holes at the lower side are formed such that an opening area of each of the first blowout holes gradually becomes larger toward a lower direction, but an opening area of one of the first blowout holes of the plurality of first blowout holes that is at a lowest position is smaller than another one of the first blowout holes of the plurality of first blowout holes that is at the second lowest position.

7. The substrate storage container according to claim 1, wherein the plurality of first blowout holes and the plurality of second blowout holes are formed such that the first blowout holes are provided more densely than the second blowout holes.

8. The substrate storage container according to claim 1, wherein the plurality of second blowout holes are formed such that one of the second blowout holes formed at a lower side has a larger opening area than another one of the second blowout holes formed at a higher side.

9. The substrate storage container according to claim 1, wherein the housing member is formed to have a first surface on which the plurality of first blowout holes are formed, and a second surface intersecting the first surface at a predetermined angle and having a size smaller than the first surface, a plurality of third blowout holes for blowing the stored gas toward the front of the container body being formed on the second surface, wherein the first surface is designed to be positioned at a center side of the container body, and wherein a total opening area of the plurality of first blowout holes is larger than a total opening area of the third blowout holes.

10. A substrate storage container comprising:

a container body capable of storing a plurality of substrates;

at least one intake valve for supplying gas to an internal space of the container body; and at least one gas replacement unit which blows the gas supplied from the at least one intake valve into the internal space of the container body, wherein the container body is formed into a front opening box and the at least one intake valve is attached to a rear of a bottom surface of the front opening box, wherein each of the at least one gas replacement unit comprises:

a housing member which stores the gas supplied from the at least one intake valve, and a cover member which covers an opening of the housing member, wherein the opening of the housing member is oriented in a front direction of the container body, and a lower portion of the housing member is connected to the at least one intake valve, wherein the cover member has a plurality of first blowout holes for blowing the stored gas toward a front of the container body, and wherein the housing member has a plurality of second blowout holes for blowing the stored gas toward a rearward direction, wherein the plurality of first blowout holes are formed such that an opening area of a first one of the first blowout holes that is at a highest position is larger than an opening area of a second one of the first blowout holes that is at a lower side of the first one of the first blowout holes, and an opening area of a third one of the first blowout holes that is at a lower side of the second one of the first blowout holes is larger than an opening area of the second one of the first blowout holes.

11. The substrate storage container according to claim 10, wherein the housing has a flat plate portion on which the second blowout holes are formed so that the gas is blown out in one direction toward the rearward direction through the flat plate portion, while the gas is blown out in at least two different directions through the cover member toward the front of the container body.

12. The substrate storage container according to claim 10, wherein at least one of the first blowout holes is positioned lower than a lowermost level of the substrates stored in the container body.

13. The substrate storage container according to claim 10, wherein the at least one gas replacement unit includes at least one air permeable filter member inside the housing member and the cover member.

14. The substrate storage container according to claim 10, wherein the plurality of first blowout holes at a middle part are formed such that an opening area of each of the first blowout holes is substantially equal.

15. The substrate storage container according to claim 10, wherein the plurality of first blowout holes at the lower side are formed such that an opening area of each of the first blowout holes gradually becomes larger toward a lower direction, but an opening area of one of the first blowout holes of the plurality of first blowout holes that is at a lowest position is smaller than another one of the first blowout holes of the plurality of first blowout holes that is at the second lowest position.

16. The substrate storage container according to claim 10, wherein the plurality of first blowout holes and the plurality of second blowout holes are formed such that the first blowout holes are provided more densely than the second blowout holes.

17. The substrate storage container according to claim 10, wherein the plurality of second blowout holes are formed such that one of the second blowout holes formed at a lower side has a larger opening area than another one of the second blowout holes formed at a higher side.

18. The substrate storage container according to claim 10, wherein the housing member is formed to have
a first surface on which the plurality of first blowout holes are formed, and
a second surface intersecting the first surface at a predetermined angle and having a size smaller than the first surface, a plurality of third blowout holes for blowing the stored gas toward the front of the container body being formed on the second surface,
wherein the first surface is designed to be positioned at a center side of the container body, and
wherein a total opening area of the plurality of first blowout holes is larger than a total opening area of the third blowout holes.

19. A gas replacement unit for a substrate storage container comprising a container body capable of storing a plurality of substrates, and at least one intake valve for supplying gas to an internal space of the container body with the at least one intake valve attached at a rear of a bottom surface of the container body, the gas replacement unit comprising:
a housing member which stores the gas supplied from the at least one intake valve; and
a cover member which covers the opening of the housing member,
wherein the opening of the housing member is oriented in a rearward direction of the container body and a lower portion of the housing member is connected to the at least one intake valve,
wherein the housing member has a plurality of first blowout holes for blowing the stored gas toward a front of the container body, and
wherein the cover member has a plurality of second blowout holes for blowing the stored gas toward the rearward direction,
wherein the plurality of first blowout holes are formed such that
an opening area of a first one of the first blowout holes that is at a highest position is larger than an opening area of a second one of the first blowout holes that is at a lower side of the first one of the first blowout holes, and
an opening area of a third one of the first blowout holes that is at a lower side of the second one of the first blowout holes is larger than an opening area of the second one of the first blowout holes.

20. A gas replacement unit for a substrate storage container comprising a container body capable of storing a plurality of substrates, and at least one intake valve for supplying gas to an internal space of the container body with the at least one intake valve attached at a rear of a bottom surface of the container body, the gas replacement unit comprising:
a housing member which stores the gas supplied from the at least one intake valve; and
a cover member which covers the opening of the housing member,
wherein the opening of the housing member is oriented in a front direction of the container body and a lower portion of the housing member is connected to the at least one intake valve,
wherein the cover member has a plurality of first blowout holes for blowing the stored gas toward a front of the container body, and
wherein the housing member has a plurality of second blowout holes for blowing the stored gas toward a rearward direction,
wherein the plurality of first blowout holes are formed such that
an opening area of a first one of the first blowout holes that is at a highest position is larger than an opening area of a second one of the first blowout holes that is at a lower side of the first one of the first blowout holes, and
an opening area of a third one of the first blowout holes that is at a lower side of the second one of the first blowout holes is larger than an opening area of the second one of the first blowout holes.

* * * * *